US012630742B2

(12) United States Patent
Mitsui et al.

(10) Patent No.: US 12,630,742 B2
(45) Date of Patent: May 19, 2026

(54) POLISHING COMPOSITION USING POLISHING PARTICLES CONTAINING BASIC SUBSTANCE AND HAVING HIGH WATER AFFINITY

(71) Applicant: NISSAN CHEMICAL CORPORATION, Tokyo (JP)

(72) Inventors: Shigeru Mitsui, Funabashi (JP);
Eiichiro Ishimizu, Funabashi (JP);
Tohru Nishimura, Funabashi (JP);
Wataru Omori, Funabashi (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 829 days.

(21) Appl. No.: 17/623,046

(22) PCT Filed: Jun. 26, 2020

(86) PCT No.: PCT/JP2020/025284
§ 371 (c)(1),
(2) Date: Dec. 27, 2021

(87) PCT Pub. No.: WO2020/262628
PCT Pub. Date: Dec. 30, 2020

(65) Prior Publication Data
US 2022/0228031 A1 Jul. 21, 2022

(30) Foreign Application Priority Data

Jun. 27, 2019 (JP) ................................. 2019-119362

(51) Int. Cl.
*C09G 1/02* (2006.01)
*H10P 52/00* (2026.01)
*H10P 52/40* (2026.01)

(52) U.S. Cl.
CPC ................ *C09G 1/02* (2013.01); *H10P 52/00* (2026.01); *H10P 52/403* (2026.01)

(58) Field of Classification Search
CPC ..... C09G 1/02; H01L 21/304; H01L 21/3212; H01L 21/31053; B24B 37/00; B24B 37/044; C09K 3/14; C09K 3/1463
See application file for complete search history.

(56) References Cited

U.S. PATENT DOCUMENTS

2015/0376461 A1 * 12/2015 Grumbine ............. B24B 37/044
252/79.1
2016/0247693 A1 8/2016 Park et al.

FOREIGN PATENT DOCUMENTS

| | | | | | |
|---|---|---|---|---|---|
| EP | 0846741 | A1 * | 6/1998 | .......... | H01L 21/304 |
| JP | 2010-161201 | A | 7/2010 | | |
| JP | 2016213216 | A * | 12/2016 | .......... | H01L 21/304 |
| JP | 2016540840 | A * | 12/2016 | .............. | C09K 3/14 |
| JP | 2017-117894 | A | 6/2017 | | |
| WO | 2015/152151 | A1 | 10/2015 | | |
| WO | WO-2018012174 | A1 * | 1/2018 | ............ | B24B 37/00 |
| WO | 2018/116890 | A1 | 6/2018 | | |

OTHER PUBLICATIONS

JP 20169540840-A_Machine_Translation (Year: 2016).*
WO 2018012174-A_Maachine_Translation (Year: 2018).*
WO_2018012174_A1_Machine_Translation (Year: 2018).*
JP 2016213216 A_Machine Translation (Year: 2016).*
Jan. 29, 2024 Office Action issued in Japanese Patent Application No. 2021-527781.
Nov. 28, 2023 Office Action issued in Taiwanese Patent Application No. 109121837.
Sep. 8, 2020 International Search Report issued in International Patent Application No. PCT/JP2020/025284.
Sep. 8, 2020 Written Opinion issued in International Patent Application No. PCT/JP2020/025284.
Apr. 20, 2022 Office Action issued in Chinese Patent Application No. 202080046110.5.
Jul. 24, 2024 Office Action issued in Japanese Patent Application No. 2021-527781.
Apr. 3, 2025 Office Action issued in Korean Patent Application No. 10-2021-7041400.
Mar. 4, 2026 Office Action issued in Japanese Patent Application No. 2021-527781.

* cited by examiner

*Primary Examiner* — Amber R Orlando
*Assistant Examiner* — Anastasia A. Kuvayskaya
(74) *Attorney, Agent, or Firm* — Oliff PLC

(57) ABSTRACT

A polishing composition that is for use in CMP polishing and that makes it possible to minimize the occurrence of defects. A polishing composition comprising silica particles, a basic nitrogen-containing organic compound, and water serving as a solvent, wherein the composition exhibits an Rsp value of the following Formula (1) of more than 0.7 and 6 or less as calculated from values measured by pulse NMR: $Rsp=(Rav-Rb)/(Rb)$ . . . (1) (wherein Rsp is an index of water affinity; Rav is the reciprocal of the relaxation time of the polishing composition; and Rb is the reciprocal of the relaxation time of the water serving as a solvent of the polishing composition).

18 Claims, No Drawings

POLISHING COMPOSITION USING POLISHING PARTICLES CONTAINING BASIC SUBSTANCE AND HAVING HIGH WATER AFFINITY

TECHNICAL FIELD

The present invention relates to a polishing composition using silica abrasive grains and a polishing method.

BACKGROUND ART

A polishing composition using silica abrasive grains has been used for polishing of a silicon wafer.

In association with recent formation of a multilayer wiring on the surface of a semiconductor substrate, a stepped substrate is planarized by filling stepped portions of the substrate with a silicon oxide film or a metal wiring for formation of a device, and a lithography process is performed on the planarized surface, followed by multilayer wiring, to thereby produce an integrated circuit. Formation of highly integrated patterns has led to further micronizing in the size of patterns. In accordance therewith, the lithography process involves the use of actinic rays such as near-ultraviolet rays, far-ultraviolet rays, or extreme ultraviolet rays, and the exposure of a resist involves the use of light having a short wavelength such as 248 nm, 193 nm, 157 nm, or 13.6 nm. In addition, electron beam lithography is used. In the case where the lithography process is repeatedly performed for formation of a multilayer wiring, exposure light having a short wavelength may be used for the lithography process. In such a case, when a polished surface of a substrate is not highly planarized, exposure light is diffusely reflected at the interface between a resist and the polished substrate surface, and a rectangular resist pattern cannot be formed. Thus, the resist pattern cannot be transferred to the underlying layer.

Therefore, a polishing composition is required to have the ability to achieve an increase in polishing rate, and to reduce occurrence of scratches on the polished surface and defects generated by residual foreign matter.

Such a polishing composition contains an aqueous medium and, for example, silica abrasive grains, an alkaline component, a water-soluble compound, a chelating agent, an oxidant, and a metal anticorrosive agent.

There has been disclosed a polishing composition containing silica particles as abrasive grains, wherein the silica particles are defined by a function representing the affinity of the silica particles to water as determined by the relationship between the reciprocal of pulse NMR relaxation time and the total surface area of the silica particles (see Patent Document 1).

There has also been disclosed a polishing composition containing silica particles as abrasive grains, wherein the relationship between the BET specific surface area of the silica particles and the specific surface area thereof as measured by pulse NMR is defined (see Patent Document 2).

There has also been disclosed a polishing composition wherein the affinity of abrasive grains to a solvent is evaluated by NMR relaxation time (see Patent Documents 3 and 4).

PRIOR ART DOCUMENTS

Patent Documents

Patent Document 1: WO 2018/116890
Patent Document 2: WO 2015/152151

Patent Document 3: JP 2017-117894 A
Patent Document 4: WO 2018/012174

SUMMARY OF THE INVENTION

Problems to be Solved by the Invention

Regarding the invention according to the appended claims (the present invention), attention has been paid to the affinity (water affinity) of silica particles used as abrasive grains to an aqueous medium contained in a polishing composition, and the parameter value as an index of the water affinity has been defined. Consequently, it has been found that the polishing rate is increased and a favorable polished surface is achieved by defining an optimum value of water affinity based on a specific combination of silica particles and a basic nitrogen-containing organic compound. Thus, an object of the present invention is to reduce generation of defects (residual foreign matter on a polished surface, and scratches) when a polishing composition is used for CMP polishing of a device wafer.

Means for Solving the Problems

A first aspect of the present invention is a polishing composition comprising silica particles, a basic nitrogen-containing organic compound, and water serving as a solvent, wherein the composition exhibits an Rsp value of the following Formula (1) of more than 0.7 and 6 or less as calculated from values measured by pulse NMR:

$$Rsp = (Rav - Rb)/(Rb) \qquad (1)$$

(wherein Rsp is an index of water affinity; Rav is the reciprocal of the relaxation time of the polishing composition; and Rb is the reciprocal of the relaxation time of the water serving as a solvent of the polishing composition).

A second aspect of the present invention is the polishing composition according to the first aspect, wherein the silica particles have an average primary particle diameter of 5 to 80 nm as measured by the nitrogen gas adsorption method, and the silica particles have an average particle diameter of 12 to 200 nm as measured by dynamic light scattering.

A third aspect of the present invention is the polishing composition according to the first or second aspect, wherein the basic nitrogen-containing organic compound is an aliphatic linear or cyclic amine containing a hydroxyl group, a carboxyl group, or a combination of these as appropriate, and the amine is a primary amine, a secondary amine, a tertiary amine, or any combination of these.

A fourth aspect of the present invention is the polishing composition according to any one of the first to third aspects, wherein the basic nitrogen-containing organic compound is a molecule having a molecular weight of 60 to 350.

A fifth aspect of the present invention is the polishing composition according to any one of the first to fourth aspects, wherein the basic nitrogen-containing organic compound is a secondary or tertiary linear aliphatic amine.

A sixth aspect of the present invention is the polishing composition according to the first or second aspect, wherein the basic nitrogen-containing organic compound is N-ethylethylenediamine or triethylamine.

A seventh aspect of the present invention is the polishing composition according to any one of the first to sixth aspects, wherein the composition comprises an alkali component containing an alkali metal hydroxide containing NaOH or KOH or ammonia and a basic nitrogen-containing organic compound, or a salt of any of these; the following relation is satisfied: (the mole number of the basic nitrogen-containing organic compound or a salt thereof)>(the mole number of the alkali metal hydroxide containing NaOH or KOH or ammonia or a salt thereof); and the composition exhibits an electrical conductivity of 100 to 650 $\mu$S/cm when the $SiO_2$ concentration is 10% by mass.

An eighth aspect of the present invention is the polishing composition according to any one of the first to seventh aspects, wherein the composition further comprises a pH adjuster containing an inorganic acid, an organic acid, an alkali metal hydroxide, an ammonium salt, ammonia, or any combination of these.

A ninth aspect of the present invention is the polishing composition according to any one of the first to eighth aspects, wherein the composition further comprises a chelating agent containing an aminocarboxylic acid chelating agent, a phosphonic acid chelating agent, or a combination of these.

A tenth aspect of the present invention is the polishing composition according to any one of the first to ninth aspects, wherein the composition has a pH of 1 to 12.

An eleventh aspect of the present invention is the polishing composition according to any one of the first to tenth aspects, wherein the composition is used for polishing of a silicon wafer, a device wafer, or an Si-containing substrate.

A twelfth aspect of the present invention is a method for producing the polishing composition according to any one of the first to eleventh aspects, the method comprising a method (A) including mixing a silica sol prepared through any one step of the following steps (a) to (d) with the basic nitrogen-containing organic compound, or a method (B) including dispersing the silica sol and the basic nitrogen-containing organic compound in an aqueous medium:

step (a): a step of preparing a silica sol by ion exchange of an aqueous sodium silicate solution and thermal treatment of the resultant aqueous active silica solution;

step (b): a step of preparing a silica sol by hydrolysis of an alkoxysilane;

step (c): a step of preparing a silica sol by wet grinding of silica powder in an aqueous medium; and step (d): a step of preparing a silica sol by dispersion, in an aqueous medium, of silica powder obtained through combustion hydrolysis of silicon tetrachloride in a flame.

A thirteenth aspect of the present invention is the method for producing the polishing composition according to the twelfth aspect, wherein the aqueous sodium silicate solution and/or the aqueous active silica solution used in the step (a) is preliminarily filtered with a filter.

A fourteenth aspect of the present invention is the method for producing the polishing composition according to the twelfth or thirteenth aspect, wherein the rate of change in average particle diameter is less than 20% as measured by dynamic light scattering before and after addition of the basic nitrogen-containing organic compound.

A fifteenth aspect of the present invention is a polishing method comprising polishing a TEOS film-coated wafer with the polishing composition according to any one of the first to eleventh aspects for 60 seconds, to thereby reduce the number of defects of 180 nm or more to 1.4 or less per $cm^2$.

A sixteenth aspect of the present invention is the polishing method according to the fifteenth aspect, wherein the TEOS film-coated wafer is a 300 mm wafer.

Effects of the Invention

Regarding the present invention, attention has been paid to the affinity (water affinity) of silica particles used as abrasive grains to an aqueous medium contained in a polishing composition, and the parameter value as an index of the water affinity has been defined. Consequently, it has been found that the polishing rate can be increased and defects generated on a polished surface can be reduced by defining an optimum value of water affinity based on a combination of silica particles and a basic nitrogen-containing organic compound. Generation of defects is attributed to occurrence of scratches or deposition of foreign matter on a stepped substrate. Although the cause of occurrence of scratches has not yet been clearly elucidated, scratches probably occur from abrasive grains or an object to be polished, or a combination of these.

When defects are present on a polished surface of a substrate, a rectangular pattern cannot be formed during a lithography process due to diffused reflection of resist exposure light or poor defocus. The resultant pattern masks the substrate during processing thereof, which causes etching resistance and poor processing of the substrate, resulting in defective production of a semiconductor device. Thus, defects need to be reduced.

Difficulty has been encountered in achieving both an increase in polishing rate and planarization of a polished surface, which are in a trade-off relationship. However, when silica particles are provided with a specific level of water affinity, defects can be reduced while the polishing rate is maintained to a certain extent.

The polishing composition contains silica particles as abrasive grains. The silica particles interact with an aqueous medium contained in the polishing composition depending on the surface state of the silica particles, to thereby affect the polishing rate or the planarity of a polished surface.

The water involved in the surface state of the silica particles contained in the polishing composition is categorized into free water and bound water. Free water is present in the vicinity of the silica particles, but is not bound to the silica particles (i.e., present in a free state). Bound water is bound to the silica particles; specifically, bound water is bound to silanol groups on the surfaces of the silica particles by hydrogen bonding. Bound water plays an important role in ensuring a good contact between the silica particles and water.

The state of water can be known by measurement of the relaxation time of protons of water molecules. The relaxation involves a step of releasing absorbed energy, and a step of transition of the precession phase of nuclear spins from a coherent state into a random state. The former step is called spin-lattice relaxation (longitudinal relaxation, relaxation time T1), and the latter step is called spin-spin relaxation (transverse relaxation, relaxation time T2). T1 relaxation is most likely to occur when the rate of molecular motion is almost equal to the resonance frequency. There is a difference in the time of response to a change in magnetic field (i.e., relaxation time) between free water molecules that are not in contact with the silica particles and water molecules that are in contact with the silica particles. It is thought that short relaxation time corresponds to a large surface area of particles that are in contact with water and high dispersibility of the particles.

T2 relaxation occurs through magnetic interaction. The method of relaxation time measurement by pulse NMR is based on the difference of T2 relaxation.

The presence of bound water and additives in specific ranges effectively contributes to an increase in polishing rate, reduction of scratches on a polished surface, and reduction of defects.

As described above, pulse NMR is an analytical method based on the difference in the time of response to a change in magnetic field (i.e., the difference in relaxation time) between solvent molecules (water molecules in the present invention) that are adsorbed on the silica particle surfaces and free-state solvent molecules that are not adsorbed on the silica particle surfaces. The solvent molecules adsorbed on the silica particle surfaces move in a limited manner, whereas the solvent molecules that are not adsorbed on the silica particle surfaces move freely. Thus, the relaxation time of the solvent molecules adsorbed on the silica particle surfaces is shorter than the relaxation time of the solvent molecules that are not adsorbed on the silica particle surfaces. Therefore, a high Rsp value is determined by pulse NMR when a large amount of water molecules are adsorbed on the silica particle surfaces.

In the present invention, the basic nitrogen-containing organic compound probably promotes polarization of silanol groups so that a large amount of water molecules are adsorbed on the silica particle surfaces.

The silica particles exhibiting an Rsp value falling within the range specified by the present invention have, on the surfaces thereof, a certain amount of silanol groups exhibiting hydrophilicity, and the silica particles are coated with water molecules or amine molecules adsorbed on the silanol groups by hydrogen bonding. Thus, the silica particles coated with water molecules or amine molecules do not cause occurrence of scrapes or scratches on a polished surface regardless of the size of the silica particles, which probably contributes to reduced generation of defects.

Even in such a case, the electrical conductivity is more preferably maintained at a certain level, since water molecules or amine molecules may be released from the silica particles by a certain change in electrical conductivity.

The polishing composition of the present invention contains silica particles exhibiting a specific Rsp value and amine molecules. Thus, the surfaces of the silica particles are coated with water molecules or amine molecules, and the composition reduces generation of scratches or defects on a polished surface.

The addition of the basic nitrogen-containing organic compound contributes to an improvement in the dispersibility of the silica particles and reduced aggregation of the particles. Since the silica particles are present in a nearly monodispersed state, the surfaces of the silica particles are provided with a large amount of silanol groups, which also leads to an increase in Rsp value. In the present invention, the rate of change in average particle diameter is 20% or less or 15% or less as measured by dynamic light scattering before and after addition of the basic nitrogen-containing organic compound.

It is thought that these factors contribute to reduction of occurrence of scratches or residual foreign matter on a polished surface.

In the present invention, when one TEOS film-coated wafer (300 nm) is polished, the number of defects of 180 nm or more can be reduced to 1,000 or less on the polished wafer. Thus, the number of defects of 180 nm or more can be reduced to 1.4 or less, or 1.2 or less, or 0.7 or less per cm² of the polished surface.

The aforementioned TEOS film can be applied by plasma CVD, reduced pressure CVD, sputtering, or EB vapor deposition.

MODES FOR CARRYING OUT THE INVENTION

The present invention is directed to a polishing composition comprising silica particles, a basic nitrogen-containing organic compound, and water serving as a solvent, wherein the composition exhibits an Rsp value of the following Formula (1) of more than 0.7 and 6 or less as calculated from values measured by pulse NMR:

$$Rsp = (Rav - Rb)/(Rb) \tag{1}$$

(wherein Rsp is an index of water affinity; Rav is the reciprocal of the relaxation time of the polishing composition; and Rb is the reciprocal of the relaxation time of the water serving as a solvent of the polishing composition).

The aforementioned silica particles are colloidal silica particles and have an average particle diameter of 12 to 200 nm or 20 to 150 nm as measured by dynamic light scattering. The silica particles contained in the dispersion have an average primary particle diameter of 5 to 80 nm, or 10 to 80 nm, or 15 to 70 nm as measured by the nitrogen gas adsorption method.

The measurement principle of the present technique (pulse NMR) is based on the difference in response to a change in magnetic field between solvent molecules that are in contact with or adsorbed on the particle surfaces and solvent molecules in the solvent bulk (i.e., free-state solvent molecules that are not in contact with the particle surfaces). In general, liquid molecules adsorbed on the particle surfaces move in a limited manner, whereas liquid molecules in the bulk liquid move freely. Consequently, the NMR relaxation time of the liquid molecules adsorbed on the particle surfaces is shorter than the relaxation time of the liquid molecules in the bulk liquid.

The relaxation time measured in the particle dispersion is the average of the two relaxation times reflected by the volume concentration of the liquid on the particle surfaces and the volume concentration of the free-state liquid (i.e., the liquid contained in the bulk liquid and not adsorbed on the particle surfaces).

The relaxation time constant R is the reciprocal of relaxation time and is determined by the formula Rav=PsRs+PbRb.

Rav is average relaxation time constant; i.e., the reciprocal of the relaxation time of the colloidal silica dispersion.

Ps is the volume concentration of the liquid on the particle surfaces; i.e., the volume concentration of the colloidal silica dispersion.

Rs is the relaxation time constant of the liquid molecules adsorbed on the particle surfaces; i.e., the reciprocal of the relaxation time of the colloidal silica dispersion.

Pb is the volume concentration of the bulk liquid; i.e., the volume concentration of a blank aqueous solution (corresponding to the colloidal silica dispersion from which the silica particles are removed).

Rb is the relaxation time constant of the bulk liquid molecules; i.e., the reciprocal of the relaxation time of the blank aqueous solution (corresponding to the colloidal silica dispersion from which the silica particles are removed).

The Rsp value is determined by the formula Rsp=(Rav−Rb)/(Rb) from values of the dispersion measured by pulse NMR.

Rav and Rb are respectively the reciprocals of the relaxation times (transverse relaxation times T2; specifically the NMR relaxation time after dispersion of silica abrasive grains, and the NMR relaxation time before dispersion of silica abrasive grains (i.e., the NMR relaxation time of only a dispersion medium)) measured with a pulse NMR apparatus Acorn Area available from Xigo Nanotools (USA) under the following measurement conditions: magnetic field: 0.3 T, measurement frequency: 13 MHz, measurement nucleus: $^1$H NMR, measurement mode: CPMG pulse sequencing, sample amount: 0.4 mL, and temperature: 30° C.

Rsp is used as an index of the water affinity of particle surfaces. In the case of the same specific surface area, a larger Rsp value indicates higher water affinity.

The basic nitrogen-containing organic compound used in the present invention is an aliphatic linear or cyclic amine that may contain a hydroxyl group, a carboxyl group, or a combination of these, and the amine is a primary amine, a secondary amine, a tertiary amine, or any combination of these.

The aforementioned amine may contain a hydroxyl group, a carboxyl group, or a combination of these. The amine contains an aliphatic linear structure or an aliphatic cyclic structure. The structure may contain a primary amine, a secondary amine, a tertiary amine, or any combination of these.

The aforementioned amine preferably contains a secondary or tertiary linear aliphatic amine. One amine molecule may contain either or both of a secondary structure and a tertiary structure. The aforementioned amine molecule, which contains a secondary or tertiary linear aliphatic amine, may further contain a primary amine.

Examples of the aforementioned basic nitrogen-containing organic compound include, but are not limited to, N-ethylethylenediamine, N-(2-hydroxyethyl)piperazine, triethylamine, and 2-aminoethanol, in particular, N-ethylethylenediamine and triethylamine.

The basic nitrogen-containing organic compound is preferably a low-molecular-weight amine having a molecular weight of 60 to 350, or 60 to 150, or 80 to 110.

These amines may be used alone or in combination of a plurality of species. In the case where a plurality of species are used in combination, when the species and the aforementioned compound have solubility in water or basicity in common, the following similar compound or a salt thereof (e.g., sulfate, hydrochloride, or nitrate) may be used in an amount of 50% by mass or less.

Examples of the primary aliphatic amine include, but are not limited to, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine.

Examples of the secondary aliphatic amine include, but are not limited to, dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, N,N-dimethyltetraethylenepentamine, N-ethylethylenediamine, and N-(2-hydroxyethyl)piperazine.

Examples of the tertiary aliphatic amine include, but are not limited to, trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of the hybrid amine include, but are not limited to, dimethylethylamine, methylethylpropylamine, benzylamine, phenethylamine, and benzyldimethylamine.

Examples of the nitrogen-containing compound having a carboxy group include, but are not limited to, aminobenzoic acid, indolecarboxylic acid, and amino acid derivatives (e.g., nicotinic acid, alanine, arginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine).

Examples of the nitrogen-containing compound having a hydroxy group (hydroxyl group), the nitrogen-containing compound having a hydroxyphenyl group, and the alcoholic nitrogen-containing compound include, but are not limited to, 2-aminoethanol, 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidineethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidineethanol, 1-aziridineethanol, N-(2-hydroxyethyl)phthalimide, and N-(2-hydroxyethyl)isonicotinamide.

The polishing composition of the present invention may contain an alkali component containing an alkali metal hydroxide containing NaOH or KOH or ammonia and a basic nitrogen-containing organic compound, or a salt of any of these, and the composition may exhibit an electrical conductivity of 100 to 650 μS/cm when the $SiO_2$ concentration is 10% by mass.

In the present invention, an alkali ion is removed from an alkaline aqueous silica sol stabilized with an alkali metal hydroxide, to thereby prepare an acidic aqueous silica sol (containing a trace amount of alkali metal ions), and the aforementioned basic nitrogen-containing organic compound is added to the acidic aqueous silica sol until a pH of 8 to 11 is achieved. Thus, the following relation is satisfied: (the mole number of the basic nitrogen-containing organic compound or a salt thereof)>(the mole number of the alkali metal hydroxide containing NaOH or KOH or ammonia or a salt thereof).

Alternatively, an acid (hydrochloric acid, sulfuric acid, nitric acid, or phosphoric acid) is added to such an alkaline silica sol, or the alkaline silica sol is converted into an acidic silica sol having a pH of 1 to 6 by a combination of cation exchange and anion exchange. Thus, preferably, the following relation is satisfied: (the mole number of the basic nitrogen-containing organic compound or a salt thereof)> (the mole number of the alkali metal hydroxide containing NaOH or KOH or ammonia or a salt thereof), and the polishing composition exhibits an electrical conductivity of 100 to 650 μS/cm when the $SiO_2$ concentration is 10% by mass.

In the present invention, the polishing composition may contain, besides the silica particles as abrasive grains and the aqueous medium, at least one additive selected from the group consisting of a pH adjuster (an alkaline component and a water-soluble compound), a chelating agent, an oxidant, and a metal anticorrosive agent.

The amount of the component (S) (i.e., all the components of the polishing composition except for the aqueous medium) is 0.01 to 20% by mass or 0.1 to 10% by mass. The silica content of the component (S) is 80 to 99.9% by mass or 90 to 99.9% by mass. The basic nitrogen-containing organic compound content of the component (S) is 0.01 to 20% by mass or 0.01 to 10% by mass.

The alkaline component includes an alkali metal hydroxide (sodium hydroxide or potassium hydroxide), ammonia, and an amine. The amine is converted into a corresponding ammonium salt in the aqueous medium, and is present in the composition.

The pH of the polishing composition of the present invention can be adjusted to 1 to 12.

The pH can be adjusted to fall within a range of 7 to 12 or 8 to 11 by addition of the alkaline component.

The pH can be adjusted to fall within a range of 1 to 7 or 1 to 6 by cation exchange or addition of an acid (hydrochloric acid, sulfuric acid, nitric acid, or phosphoric acid).

The water-soluble compound used may be any water-soluble compound.

Examples of the water-soluble compound include monomers having a carboxylic group, such as acrylic acid, methacrylic acid, and maleic acid; polymers of the monomers, such as polyacrylic acid and polymethacrylic acid; and salts of the polymers, such as ammonium polyacrylate, potassium polyacrylate, ammonium polymethacrylate, and potassium polymethacrylate. Examples of other usable water-soluble compounds include, but are not limited to, alginic acid, pectic acid, carboxymethyl cellulose, polyaspartic acid, polyglutamic acid, polyamide acid, polyamide acid ammonium salt, polyvinyl pyrrolidone, hydroxyethyl cellulose, glycerin, polyglycerin, polyvinyl alcohol, or carboxy group- or sulfonic group-modified polyvinyl alcohol.

The amount of the water-soluble compound contained in the composition may be 0.01 to 10% by mass relative to the silica particles.

The chelating agent used may be an aminocarboxylic acid chelating agent or a phosphonic acid chelating agent. The amount of the chelating resin contained in the composition may be 0.01 to 10% by mass relative to the silica particles.

Examples of the oxidant include hydrogen peroxide, nitric acid, potassium periodate, hypochlorous acid, and ozone water. The amount of the oxidant contained in the composition may be, but not limited to, 0.01 to 10% by mass relative to the silica particles.

Examples of the metal anticorrosive agent include, but are not limited to, a triazole compound, a pyridine compound, a pyrazole compound, a pyrimidine compound, an imidazole compound, a guanidine compound, a thiazole compound, a tetrazole compound, a triazine compound, and hexamethylenetetramine.

Examples of the triazole compound include, but are not limited to, 1,2,3-triazole, 1,2,4-triazole, 3-amino-1H-1,2,4-triazole, benzotriazole (BTA), 1-hydroxybenzotriazole, 1-hydroxypropylbenzotriazole, 2,3-dicarboxypropylbenzotriazole, 4-hydroxybenzotriazole, 4-carboxy-1H-benzotriazole, 4-carboxy-1H-benzotriazole methyl ester (methyl 1H-benzotriazole-4-carboxylate), 4-carboxy-1H-benzotriazole butyl ester (butyl 1H-benzotriazole-4-carboxylate), 4-carboxy-1H-benzotriazole octyl ester (octyl 1H-benzotriazole-4-carboxylate), 5-hexylbenzotriazole, (1,2,3-benzotriazolyl-1-methyl)(1,2,4-triazolyl-1-methyl)(2-ethylhexyl)

amine, tolyltriazole, naphthotriazole, bis[(1-benzotriazolyl) methyl]phosphonic acid, 3H-1,2,3-triazolo[4,5-b]pyridin-3-ol, 1H-1,2,3-triazolo[4,5-b]pyridine, 1-acetyl-1H-1,2,3-triazolo[4,5-b]pyridine, 3-hydroxypyridine, 1,2,4-triazolo[1,5-a]pyrimidine, 1,3,4,6,7,8-hexahydro-2H-pyrimido[1,2-a]pyrimidine, 2-methyl-5,7-diphenyl-[1,2,4]triazolo[1,5-a]pyrimidine, 2-methylsulfanyl-5,7-diphenyl-[1,2,4]triazolo[1,5-a]pyrimidine, and 2-methylsulfanyl-5,7-diphenyl-4,7-dihydro-[1,2,4]triazolo[1,5-a]pyrimidine.

Examples of the pyridine compound include, but are not limited to, pyridine, 8-hydroxyquinoline, prothionamide, 2-nitropyridin-3-ol, pyridoxamine, nicotinamide, iproniazid, isonicotinic acid, benzo[f]quinoline, 2,5-pyridinedicarboxylic acid, 4-styrylpyridine, anabasine, 4-nitropyridine-1-oxide, ethyl pyridine-3-acetate, quinoline, 2-ethylpyridine, quinolinic acid, arecoline, citrazinic acid, pyridine-3-methanol, 2-methyl-5-ethylpyridine, 2-fluoropyridine, pentafluoropyridine, 6-methylpyridin-3-ol, and ethyl pyridine-2-acetate.

Examples of the pyrazole compound include, but are not limited to, pyrazole, 1-allyl-3,5-dimethylpyrazole, 3,5-di(2-pyridyl)pyrazole, 3,5-diisopropylpyrazole, 3,5-dimethyl-1-hydroxymethylpyrazole, 3,5-dimethyl-1-phenylpyrazole, 3,5-dimethylpyrazole, 3-amino-5-hydroxypyrazole, 4-methylpyrazole, N-methylpyrazole, 3-aminopyrazole, and 3-aminopyrazole.

Examples of the pyrimidine compound include, but are not limited to, pyrimidine, 1,3-diphenyl-pyrimidine-2,4,6-trione, 1,4,5,6-tetrahydropyrimidine, 2,4,5,6-tetraaminopyrimidine sulfate, 2,4,5-trihydroxypyrimidine, 2,4,6-triaminopyrimidine, 2,4,6-trichloropyrimidine, 2,4,6-trimethoxypyrimidine, 2,4,6-triphenylpyrimidine, 2,4-diamino-6-hydroxypyrimidine, 2,4-diaminopyrimidine, 2-acetamidopyrimidine, 2-aminopyrimidine, and 4-aminopyrazolo[3,4-d]pyrimidine.

Examples of the imidazole compound include, but are not limited to, imidazole, 1,1'-carbonylbis-1H-imidazole, 1,1'-oxalyldiimidazole, 1,2,4,5-tetramethylimidazole, 1,2-dimethyl-5-nitroimidazole, 1,2-dimethylimidazole, 1-(3-aminopropyl)imidazole, 1-butylimidazole, 1-ethylimidazole, 1-methylimidazole, and benzimidazole.

Examples of the guanidine compound include, but are not limited to, guanidine, 1,1,3,3-tetramethylguanidine, 1,2,3-triphenylguanidine, 1,3-di-o-tolylguanidine, and 1,3-diphenylguanidine.

Examples of the thiazole compound include, but are not limited to, thiazole, 2-mercaptobenzothiazole, and 2,4-dimethylthiazole.

Examples of the tetrazole compound include, but are not limited to, tetrazole, 5-methyltetrazole, 5-amino-1H-tetrazole, and 1-(2-dimethylaminoethyl)-5-mercaptotetrazole.

Examples of the triazine compound include, but are not limited to, triazine and 3,4-dihydro-3-hydroxy-4-oxo-1,2,4-triazine.

The amount of the metal anticorrosive agent contained in the composition may be 0.0001 to 10% by mass relative to the silica particles.

Silica used in the present invention is a silica sol prepared through any one step of the following steps (a) to (d). The polishing composition can be produced by a method (A) including mixing the silica sol with the aforementioned basic nitrogen-containing organic compound, or a method (B) including dispersing the silica sol and the basic nitrogen-containing organic compound in an aqueous medium.

The method (A) involves mixing a silica source (silica sol or silica sol-containing polishing composition) with the basic nitrogen-containing organic compound. The method (B) involves dispersing the silica source and the basic nitrogen-containing organic compound in an aqueous medium. In this case, the method (B) is categorized into a method (B1) wherein the silica source is added in the form of silica sol, and a method (B2) wherein the silica sol is converted into silica powder and then dispersed in an aqueous medium.

The silica source is produced through any one step of the following steps (a) to (d):

step (a): a step of preparing a silica sol by ion exchange of an aqueous sodium silicate solution and thermal treatment of the resultant aqueous active silica solution;
  step (b): a step of preparing a silica sol by hydrolysis of an alkoxysilane;
  step (c): a step of preparing a silica sol by wet grinding of silica powder in an aqueous medium; and
  step (d): a step of preparing a silica sol by dispersion, in an aqueous medium, of silica powder obtained through combustion hydrolysis of silicon tetrachloride in a flame.

The step (a) can be roughly divided into a step (a-I) of preparing active silica, a step (a-II) of heating the active silica for granulation, and a step (a-III) of regulating the concentration of the resultant silica sol.

The step (a-I) of preparing active silica is divided into a step (a-I) of preparing active silica, a step (a-I-I) of highly purifying the active silica, and a step (a-I-II) of recovering the highly purified active silica. The step (a-I) is an essential step, and the steps (a-I-I) and (a-I-II) are optional steps.

For example, in the step (a-I), an aqueous alkali metal silicate solution (wherein a water-soluble alkali metal silicate containing a metal oxide other than silica in an amount of 300 to 500,000 ppm relative to silica is dissolved at a concentration of 0.5 to 10.0% by mass or 1 to 6% by weight in terms of $SiO_2$ derived from the silicate) is brought into contact with a hydrogen-type strongly acidic cation exchange resin, to thereby prepare an aqueous active silica solution having an $SiO_2$ concentration of 1 to 6% by mass, and the resultant solution is recovered.

The step (a-II) of heating the active silica for granulation includes the following steps (a-II-I) and (a-II-II):

step (a-II-I): a step of adding an aqueous solution of an alkali metal hydroxide or ammonia to the aqueous active silica solution recovered in the step (a-I), to thereby prepare a stabilized aqueous active silica solution having an $SiO_2$ concentration of 0.5 to 10.0% by mass or 1 to 6% by mass and a pH of 7 to 9; and
  step (a-II-II): a step of providing an aqueous alkali metal silicate solution or an aqueous ammonia silicate solution prepared by addition of an aqueous solution of an alkali metal hydroxide or ammonia hydroxide to the aqueous active silica solution recovered in the step (a-II-I), or an aqueous alkali metal silicate solution or an aqueous ammonia silicate solution having a pH of 10 to 12.5 and an $SiO_2$ concentration of 0.1 to 8% by mass prepared by concentration or dilution of the above-prepared aqueous solution, or an aqueous active silica solution prepared in the same manner as in the step (a-II-I), so that the resultant mixture is maintained at a temperature of 110 to less than 150° C., or 110 to 145° C., or 110 to 140° C., or 110 to 135° C., or 110 to 130° C. with sufficient stirring for 1 to 30 hours until the mixture achieves a pH of 9 to 12.

The step (a-III) of regulating the concentration of the resultant silica sol is a step of concentrating the silica sol to a concentration of 10 to 50% by mass. Impurities may be removed before or after the concentration. The step (a-III) is not essential and may be performed as appropriate.

The step (a-III) is followed by the following steps:

step (a-IV): a step of bringing the stable aqueous silica sol prepared in the step (a-III) into contact with a hydrogen-type strongly acidic cation exchange resin, and then bringing the thus-prepared aqueous silica sol into contact with a hydroxyl-type strongly basic anion exchange resin, to thereby prepare an acidic aqueous silica sol substantially not containing a polyvalent metal oxide other than silica; and
  step (a-V): a step of adding an alkali to the acidic aqueous sol prepared in the step (a-IV) so that the pH of the sol is adjusted to 8 to 11, to thereby prepare a stable aqueous silica sol having an $SiO_2$ concentration of 10 to 50% by mass or 30 to 50% by mass, and substantially not containing a polyvalent metal oxide other than silica, wherein the colloidal silica has an average particle diameter of 10 to 30 nm.

The aforementioned step (a-I) preferably involves the use of sodium water glass (the ratio by mole of $SiO_2/Na_2O$ is about 2 to 4), which is an inexpensive industrial product. The product mainly contains, as impurities, relatively high polyvalent metals, such as aluminum, iron, calcium, and magnesium. The aqueous alkali metal silicate solution is brought into contact with the aforementioned hydrogen-type strongly acidic cation exchange resin. Preferably, this contact can be performed by allowing the solution to pass through a column charged with the ion change resin. The liquid passing through the column is recovered as an aqueous active silica solution having an $SiO_2$ concentration of 1 to 6% by mass (preferably 2 to 6% by mass). The hydrogen-type cation exchange resin is used in such an amount enough to exchange all the alkali metal ions contained in the aqueous alkali metal silicate solution with hydrogen ions. Preferably, the solution is allowed to pass through the column at a space velocity of about 1 to 10 per hour.

Examples of the strong acid used in the step (a-I-I) include inorganic acids, such as hydrochloric acid, nitric acid, and sulfuric acid. Nitric acid is most preferably used for increasing the rate of removal of aluminum and iron components. In the step (a-I-II), the aqueous solution prepared in the step (a-I-I) is first brought into contact with the aforementioned hydrogen-type strongly acidic cation exchange resin. This contact can be preferably performed by allowing the solution to pass through a column charged with the hydrogen-type strongly acidic cation exchange resin at 0 to 60° C. (preferably 5 to 50° C.) at a space velocity of 2 to 20 per hour. Subsequently, the resultant aqueous solution is brought into contact with the aforementioned hydroxyl-type strongly basic anion exchange resin (preferably, immediately after passing through the column) at 0 to 60° C. (preferably 5 to 50° C.).

The aqueous alkali hydroxide solution used in the step (a-II) is preferably prepared by dissolving an alkali hydroxide (commercially available industrial product) having a component concentration of 95% or more in an ion-exchange water so as to achieve a concentration of preferably 2 to 20% by mass.

The apparatus used in the step (a-III) may be a common acid-resistant, alkali-resistant, and pressure-resistant container equipped with, for example, a stirrer, a temperature controller, a liquid level sensor, a pressure reducing device, a liquid feeding device, and the aforementioned cooling device.

In the step (a-III), the liquid temperature is maintained at 110 to less than 150° C. in the container.

In the step (a-IV), the contact between the stable aqueous sol and the ion exchange resin can be performed in the same manner as in the step (a-I).

The alkali used in the step (a-V) may be a commercially available industrial product, but is preferably a product of high purity. When the alkali is ammonia, aqueous ammonia having a concentration of about 5 to 28% by mass is preferably used. The ammonia may be replaced by, for example, quaternary ammonium hydroxide, guanidine hydroxide, or water-soluble amine. In the present invention, potassium hydroxide is preferably used.

The silica source used in the present invention may be a silica sol prepared by hydrolysis of an alkoxysilane in the step (b). The hydrolysis is performed by adding an alkoxysilane to an organic solvent (methanol) containing a catalyst and water. The alkoxysilane used is tetramethoxysilane or tetraethoxysilane. The catalyst used is ammonia or an alkali metal hydroxide. In order to achieve high purity, ammonia is used as a volatile catalyst.

The silica source used in the present invention may be prepared through the step (c) by wet grinding of silica powder in an aqueous medium. The silica powder used may be silica powder obtained by grinding of, for example, natural silica sand, which is distinguished from the raw material used in the following step (d). The wet grinding may involve the addition of an acid or an alkali. For the wet grinding, preferably, the silica powder is ground with, for example, a ball mill, a colloid mill, a sand mill, or a disper so as to achieve a primary particle diameter falling within a colloidal range (i.e., suitable as a silica source used in the present invention), and the resultant particles are dispersed in an aqueous medium.

The silica source used in the present invention may be prepared through the step (d) by wet grinding of silica obtained through combustion hydrolysis of silicon tetrachloride in a flame. The wet grinding may involve the addition of an acid or an alkali. For the wet grinding, preferably, the silica is ground with, for example, a ball mill, a colloid mill, a sand mill, or a disper so as to achieve a primary particle diameter falling within a colloidal range (i.e., suitable as a silica source used in the present invention), and the resultant particles are dispersed in an aqueous medium.

According to the present invention, when the basic nitrogen-containing organic compound is added to the silica source (silica sol or silica sol-containing polishing composition), the rate of change in average particle diameter of the silica source as measured by dynamic light scattering is preferably 20% or less or 15% or less as compared with that before addition of the basic nitrogen-containing organic compound.

The aqueous sodium silicate solution and/or the aqueous active silica solution used in the step (a) may be preliminarily filtered with a filter.

The silica concentration of the aqueous sodium silicate solution may be adjusted to 0.5 to 10.0% by mass, and then the aqueous sodium silicate solution may be filtered with a filter exhibiting a rate of removal of particles having a primary particle diameter of 1.0 μm of 50% or more, or 60% or more, or 80% or more and exhibiting a filtration speed of 13 L/minute to 400 L/minute per $m^2$ of filtration area.

Alternatively, the aqueous sodium silicate solution having a silica concentration of 0.5% by mass to 10.0% by mass may be subjected to cation exchange for removal of an alkali component, to thereby prepare an aqueous active silica solution, and the aqueous active silica solution may be filtered with a filter exhibiting a rate of removal of particles having a primary particle diameter of 1.0 μm of 50% or more, or 60% or more, or 80% or more and exhibiting a filtration speed of 13 L/minute to 400 L/minute per $m^2$ of filtration area.

In a planarization process for a semiconductor device, a polishing step using a polishing agent containing colloidal silica is followed by removal of the colloidal silica (i.e., abrasive grains) and microparticles through washing. Spherical particles are easily removed through washing after polishing, but plate-like particles are difficult to remove even through washing after polishing. The particles to be removed with the aforementioned filter are particles that are present in the aqueous sodium silicate solution or aqueous active silica solution serving as a raw material in a silica sol production process and that contain plate-like microsilica as a main component.

The silica sol is produced and then prepared into a polishing composition. Preferably, coarse particles (containing silica as a main component), which may cause generation of defects during polishing, are preliminarily removed in a silica sol production process.

Examples of the aforementioned filter include a membrane filter, a pleated filter, a depth filter, a spool filter, a surface filter, a roll filter, a depth pleated filter, and a diatomaceous earth-containing filter. The aforementioned filter is preferably a membrane filter having an absolute pore size of 0.3 to 3.0 μm.

The aforementioned rate of removal is measured as follows. For example, 30 mL of an aqueous sodium silicate solution or aqueous active silica solution (25° C.) having a silica concentration of 4% by mass is filtered with a membrane filter having an absolute pore size of 0.4 μm (filtration area: 4.90 $cm^2$), and then the membrane filter is observed with a scanning electron microscope at a magnification of 5,000. In this case, a rectangular observation region having dimensions of 15 μm×20 μm is defined as one visual field, and one count is given when one or more plate-like microparticles are present in one visual field. The presence or absence of counts is determined in all non-overlapping 100 visual fields, and the total number of counts is defined as the presence (%) of the plate-like microparticles.

The polishing composition of the present invention can be used for polishing of a semiconductor wafer, a semiconductor device (device wafer), and an Si-containing substrate such as a quartz substrate.

CMP (chemical mechanical polishing) is used for a semiconductor device, and can be applied for forming a wiring on a semiconductor substrate. Examples of the polishing target, to which the polishing can be applied, include an electrically conductive material layer (wiring layer), a barrier layer (a layer formed of a barrier metal, such as titanium nitride or tantalum nitride for preventing diffusion of copper into an insulating layer), and an insulating layer (a layer formed of an interlayer insulating material, low-k material, such as $SiO_2$, SiOC, or porous silica).

More specifically, examples of the material forming the electrically conductive material layer include, but are not limited to, copper metals, such as copper, copper alloy, copper oxide, and copper alloy oxide; tungsten metals, such as tungsten, tungsten nitride, and tungsten alloy; cobalt metals, such as cobalt, cobalt alloy, cobalt oxide, and cobalt alloy oxide; silver; and gold. Of these, preferred is at least one copper metal selected from the group consisting of copper, copper alloy, copper oxide, and copper alloy oxide, and more preferred is copper. The electrically conductive material can be formed by, for example, any known sputtering or plating technique.

The barrier metal forming the barrier layer is provided for preventing diffusion of the electrically conductive material into the insulating material, and for improving the adhesion between the insulating material and the electrically conductive material. The barrier metal material forming the barrier metal is preferably at least one selected from the group consisting of a tantalum metal, a titanium metal, a tungsten metal, a ruthenium metal, a cobalt metal, and a manganese metal. Specific examples of the barrier metal material include, but are not limited to, tantalum metals, such as tantalum, tantalum nitride, and tantalum alloy; titanium metals, such as titanium, titanium nitride, and titanium alloy; tungsten metals, such as tungsten and tungsten alloy; ruthenium metals, such as ruthenium and ruthenium alloy; cobalt metals, such as cobalt and cobalt alloy; and manganese metals, such as manganese and manganese alloy.

Examples of the material forming the insulating material include, but are not limited to, a silicon material and an organic polymer. The insulating material may be in the form of a film (insulating film, for example, interlayer insulating film). Examples of the insulating film include, but are not limited to, a silicon coating film and an organic polymer film. The insulating film can be formed by, for example, CVD, spin coating, dip coating, or spraying.

Examples of the aforementioned silicon material include a silica material and a low-k material (low dielectric constant material). Examples of the silica material include silicon dioxide; fluorosilicate glass; organosilicate glass prepared from trimethylsilane or dimethoxydimethylsilane serving as a starting material; porous organosilicate glass; silicon oxynitride; and silsesquioxane hydride. Examples of the low-k material include, but are not limited to, silicon carbide and silicon nitride.

Regarding the polishing method according to the present invention, for example, an electrically conductive thin film is formed on a silicon substrate from an electrically conductive material, and a resist film is formed on the electrically conductive thin film. The resist layer is subjected to light exposure and development by lithography using a circuit pattern as a mask, to thereby transfer the pattern onto the resist layer. The transferred pattern is used as a mask, and the electrically conductive film is subjected to dry etching using a highly anisotropic ionic gas. Examples of the usable gas species include, but are not limited to, tetrafluoromethane ($CF_4$), perfluorocyclobutane ($C_4F_8$), perfluoropropane ($C_3F_8$), trifluoromethane, carbon monoxide, argon, oxygen, nitrogen, sulfur hexafluoride, difluoromethane, nitrogen trifluoride, chlorine trifluoride, chlorine, trichloroborane, and dichloroborane.

Subsequently, the resist film is subjected to ashing with oxygen gas to remove the resist layer. Alternatively, the resist layer may be removed with a chemical (e.g., a mixture of sulfuric acid and hydrogen peroxide, or a mixture of ammonia and hydrogen peroxide) for protection of the substrate.

Thereafter, an insulating film is formed to prevent a short circuit with an upper-layer wiring. The pattern of an underlayer wiring is reflected on the wafer surface on which interlayer insulating film is formed, and irregularities of various sizes are formed on the insulating film. When the upper layer is further coated with a resist film, and the wiring is processed by lithography, the presence of these irregularities causes a diffused reflection at the interface between the resist and the insulating film during resist exposure. Thus, a rectangular resist pattern cannot be formed, and difficulty is encountered in processing the surface of the underlayer. Therefore, the wafer surface is planarized. The interlayer insulating film is planarized by CMP.

Although aluminum has been conventionally used as the wiring material, it has a low melting point and poses problems with reliability, such as disconnection during flow of a large current. Thus, aluminum wirings have been replaced by copper wirings. However, there is a problem in that copper may diffuse into an insulating layer. Therefore, in a damascene process, trenches called "damascene" are formed, and then copper is embedded in the trenches. In order to prevent diffusion of copper into the insulating layer, a barrier layer may be formed between the copper and the insulating layer. Since copper irregularities are generated by embedment of copper to form a copper wiring layer, the surface of the copper wiring layer needs to be planarized for further lithography of an upper layer. The copper planarization by dry etching with a gas is difficult because of high hardness of copper, and thus polishing by CMP is performed.

EXAMPLES

Example 1

Silica sol 1 treated with potassium hydroxide to have alkalinity (available from Nissan Chemical Corporation, average primary particle diameter as measured by the BET method (nitrogen gas adsorption method): 20 nm, average particle diameter as measured by DLS (dynamic light scattering): 32.2 nm, $SiO_2$ concentration: 25.5% by mass, $Na_2O/SiO_2$=3,000 ppm, pH 10) was filtered with a 0.3 μm cartridge filter, and then converted into an acidic silica sol by ion exchange. Thereafter, pure water and a basic nitrogen-containing organic compound (N-ethylethylenediamine) were added to the silica sol, to thereby prepare a polishing composition having an $SiO_2$ concentration of 10% by mass and a pH of 10. The component (S) of the polishing composition of Example 1 (i.e., all the components of the composition except for the aqueous medium) had an $SiO_2$ content of 98.2% by mass and a basic nitrogen-containing organic compound content of 1.8% by mass. In the polishing composition of Example 1 after addition of the basic nitrogen-containing organic compound, the average primary particle diameter as measured by the BET method was 20 nm, and the average particle diameter as measured by DLS was 31.9 nm.

Examples 2 to 4

The same procedure as in Example 1 was performed, except that the basic nitrogen-containing organic compound was replaced by one shown in Table 1, to thereby prepare a polishing composition. The component (S) of the polishing composition of Example 2 (i.e., all the components of the composition except for the aqueous medium) had an $SiO_2$ content of 93.7% by mass and a basic nitrogen-containing organic compound content of 6.3% by mass. The component (S) of the polishing composition of Example 3 (i.e., all the components of the composition except for the aqueous medium) had an $SiO_2$ content of 97.7% by mass and a basic nitrogen-containing organic compound content of 2.3% by mass. The component (S) of the polishing composition of Example 4 (i.e., all the components of the composition except for the aqueous medium) had an $SiO_2$ content of 97.9% by mass and a basic nitrogen-containing organic compound content of 2.1% by mass.

In the polishing composition of Example 2 after addition of the basic nitrogen-containing organic compound, the average primary particle diameter as measured by the BET method was 20 nm, and the average particle diameter as measured by DLS was 31.7 nm. In the polishing composition of Example 3 after addition of the basic nitrogen-containing organic compound, the average primary particle diameter as measured by the BET method was 20 nm, and the average particle diameter as measured by DLS was 31.5 nm. In the polishing composition of Example 4 after addition of the basic nitrogen-containing organic compound, the average primary particle diameter as measured by the BET method was 20 nm, and the average particle diameter as measured by DLS was 31.8 nm.

Example 5

Silica sol 2 (available from Nissan Chemical Corporation, average primary particle diameter as measured by the BET method (nitrogen gas adsorption method): 20 nm, average particle diameter as measured by DLS (dynamic light scattering): 29.2 nm, $SiO_2$ concentration: 41% by mass, $Na_2O/SiO_2=50$ ppm, pH 10) was filtered with a 0.3 μm cartridge filter, and then converted into an acidic sol by ion exchange. Thereafter, pure water and a basic nitrogen-containing organic compound were added to the sol, to thereby prepare a polishing composition having an $SiO_2$ concentration of 10% by mass and a pH of 10. The component (S) of the polishing composition of Example 5 (i.e., all the components of the composition except for the aqueous medium) had an $SiO_2$ content of 96.4% by mass and a basic nitrogen-containing organic compound content of 3.6% by mass.

In the polishing composition of Example 5 after addition of the basic nitrogen-containing organic compound, the average primary particle diameter as measured by the BET method was 20 nm, and the average particle diameter as measured by DLS was 32.5 nm.

Examples 6 to 8

The same procedure as in Example 5 was performed, except that the basic nitrogen-containing organic compound was replaced by one shown in Table 1, to thereby prepare a polishing composition. The component (S) of the polishing composition of Example 6 (i.e., all the components of the composition except for the aqueous medium) had an $SiO_2$ content of 91.5% by mass and a basic nitrogen-containing organic compound content of 8.5% by mass. The component (S) of the polishing composition of Example 7 (i.e., all the components of the composition except for the aqueous medium) had an $SiO_2$ content of 97.8% by mass and a basic nitrogen-containing organic compound content of 2.2% by mass. The component (S) of the polishing composition of Example 8 (i.e., all the components of the composition except for the aqueous medium) had an $SiO_2$ content of 97.7% by mass and a basic nitrogen-containing organic compound content of 2.3% by mass.

In the polishing composition of Example 6 after addition of the basic nitrogen-containing organic compound, the average primary particle diameter as measured by the BET method was 20 nm, and the average particle diameter as measured by DLS was 30.0 nm. In the polishing composition of Example 7 after addition of the basic nitrogen-containing organic compound, the average primary particle diameter as measured by the BET method was 20 nm, and the average particle diameter as measured by DLS was 29.8 nm. In the polishing composition of Example 8 after addition of the basic nitrogen-containing organic compound, the average primary particle diameter as measured by the BET method was 20 nm, and the average particle diameter as measured by DLS was 29.2 nm.

Example 9

Pure water and a basic nitrogen-containing organic compound were added to Silica sol 3 filtered with a cartridge filter (pore size: 3 μm) (available from Fuso Chemical Co., Ltd., average primary particle diameter as measured by the BET method (nitrogen gas adsorption method): 17 nm, average particle diameter as measured by DLS (dynamic light scattering): 26.8 nm, $SiO_2$ concentration: 19.5% by mass, $Na_2O/SiO_2=350$ ppb), to thereby prepare a polishing composition having an $SiO_2$ concentration of 10% by mass and a pH of 10. The component (S) of the polishing composition of Example 9 (i.e., all the components of the composition except for the aqueous medium) had an $SiO_2$ content of 97.9% by mass and a basic nitrogen-containing organic compound content of 2.1% by mass.

In the polishing composition of Example 9 after addition of the basic nitrogen-containing organic compound, the average primary particle diameter as measured by the BET method was 17 nm, and the average particle diameter as measured by DLS was 27.4 nm.

Example 10

The same procedure as in Example 9 was performed, except that the basic nitrogen-containing organic compound was replaced by one shown in Table 1, to thereby prepare a polishing composition. The component (S) of the polishing composition of Example 10 (i.e., all the components of the composition except for the aqueous medium) had an $SiO_2$ content of 97.6% by mass and a basic nitrogen-containing organic compound content of 2.4% by mass.

In the polishing composition of Example 10 after addition of the basic nitrogen-containing organic compound, the average primary particle diameter as measured by the BET method was 17 nm, and the average particle diameter as measured by DLS was 27.1 nm.

Comparative Example 1

Silica sol 1 treated with potassium hydroxide to have alkalinity (available from Nissan Chemical Corporation, average primary particle diameter as measured by the BET method (nitrogen gas adsorption method): 20 nm, average particle diameter as measured by DLS (dynamic light scattering): 32.2 nm, $SiO_2$ concentration: 25.5% by mass, $Na_2O/SiO_2=3,000$ ppm, pH 10) was filtered with a 0.3 μm cartridge filter, to thereby prepare a polishing composition.

Comparative Example 2

Silica sol 2 (available from Nissan Chemical Corporation, average primary particle diameter as measured by the BET method (nitrogen gas adsorption method): 20 nm, average particle diameter as measured by DLS (dynamic light scattering): 29.2 nm, $SiO_2$ concentration: 41% by mass, $Na_2O/SiO_2=50$ ppm, pH 10) was filtered with a 0.3 μm cartridge filter, to thereby prepare a polishing composition.

Comparative Example 3

Silica sol 3 filtered with a cartridge filter (pore size: 3 μm) (available from Fuso Chemical Co., Ltd., average primary particle diameter as measured by the BET method (nitrogen gas adsorption method): 17 nm, average particle diameter as measured by DLS (dynamic light scattering): 26.8 nm, $SiO_2$ concentration: 19.5% by mass, $Na_2O/SiO_2=350$ ppb) was used as a polishing composition.

TABLE 1

| Example | Silica sol | Basic nitrogen-containing organic compound |
|---|---|---|
| Example 1 | Silica sol 1 | N-ethylethylenediamine |
| Example 2 | Silica sol 1 | N-(2-hydroxyethyl)piperazine |
| Example 3 | Silica sol 1 | Triethylamine |
| Example 4 | Silica sol 1 | 2-Aminoethanol |
| Example 5 | Silica sol 2 | N-ethylethylenediamine |
| Example 6 | Silica sol 2 | N-(2-hydroxyethyl)piperazine |
| Example 7 | Silica sol 2 | Triethylamine |
| Example 8 | Silica sol 2 | 2-Aminoethanol |
| Example 9 | Silica sol 3 | N-ethylethylenediamine |
| Example 10 | Silica sol 3 | Triethylamine |
| Comparative Example 1 | Silica sol 1 | Potassium hydroxide |
| Comparative Example 2 | Silica sol 2 | Potassium hydroxide |
| Comparative Example 3 | Silica sol 3 | Potassium hydroxide |

(Pulse NMR Measurement)

The transverse relaxation time of each of the polishing compositions of the Examples and Comparative Examples was measured with a pulse NMR apparatus Acorn Area available from Xigo Nanotools under the following measurement conditions: magnetic field: 0.3 T, measurement frequency: 13 MHz, measurement nucleus: $^1$H NMR, measurement mode: CPMG pulse sequencing, sample amount: 0.4 mL, and temperature: 30° C. Pure water was used to measure the transverse relaxation time of a blank liquid, and Rsp was determined by the formula Rsp=(Rav−Rb)/Rb (wherein Rav is the reciprocal of the relaxation time of each polishing composition, and Rb is the reciprocal of the relaxation time of the blank liquid).

(LPC Measurement)

The number of particles having a size of 0.16 μm or more contained in each of the polishing compositions of the Examples and Comparative Examples was measured with AccuSizer (registered trademark) FXnano (available from Particle Sizing Systems, USA).

Polishing conditions and washing method were as described below.

(pH Measurement)

The pH of each polishing composition was measured with a multi water quality meter (model number: MM-60R, available from DKK-TOA CORPORATION) and a pH composite electrode (model number: GST-5741C, available from DKK-TOA CORPORATION).

(Electrical Conductivity)

The electrical conductivity of each polishing composition was measured with an electrical conductivity meter (model number: CM-30R, available from DKK-TOA CORPORATION) and an electrical conductivity cell (model number: CT57101B, available from DKK-TOA CORPORATION).

(Measurement of Average Particle Diameter by Dynamic Light Scattering)

The average particle diameter was measured with a particle diameter-zeta potential-molecular weight measuring device (Zetasizer Nano ZS, available from Malvern).

(Polishing Conditions)

Polishing machine: ChaMP 332 (for 12 inches) available from TOKYO SEIMITSU CO., LTD.

Processing pressure: 1.7 psi

Rotation speed of surface plate: 90 rpm

Rotation speed of head: 90 rpm

Polishing pad: Nitta & Haas IC1400XY+Perforate

Dresser: 3M A2865 (#80 diamond)

Feed rate of polishing diluent: 300 mL/min

Polishing time: 60 sec

Substrate: TEOS film-coated wafer (Washing Conditions)

A chemical brush was used. Washing was first performed with an acidic chemical, followed by rinsing with pure water and then drying.

(Measurement of Defects)

For measurement of the number of defects, defects of 180 nm or more were counted with Hitachi LS6700.

TABLE 2

| Example | Rsp | LPC | Number of defects | pH | Electrical conductivity | DLS change rate |
|---|---|---|---|---|---|---|
| Example 1 | 2.3 | $2.1 \times 10^7$ | 265 | 9.9 | 270 | 0.9 |
| Example 2 | 2.9 | $3.1 \times 10^7$ | 868 | 9.9 | 323 | 1.6 |
| Example 3 | 1.4 | $6.4 \times 10^7$ | 167 | 10.0 | 306 | 2.2 |
| Example 4 | 1.1 | $2.6 \times 10^7$ | 540 | 10.0 | 419 | 1.2 |
| Example 5 | 2.0 | $3.4 \times 10^8$ | 148 | 10.2 | 555 | 11.3 |
| Example 6 | 2.6 | $2.2 \times 10^8$ | 745 | 10.0 | 500 | 2.7 |
| Example 7 | 1.0 | $2.4 \times 10^8$ | 100 | 10.1 | 523 | 2.1 |
| Example 8 | 0.8 | $3.4 \times 10^8$ | 643 | 9.9 | 616 | 0 |
| Example 9 | 5.4 | $2.0 \times 10^7$ | 254 | 9.8 | 210 | 2.2 |
| Example 10 | 2.9 | $2.9 \times 10^7$ | 294 | 9.8 | 277 | 1.1 |
| Comparative Example 1 | 1.0 | $4.3 \times 10^7$ | 2185 | 10.2 | 945 | Blank |
| Comparative Example 2 | 0.5 | $4.1 \times 10^8$ | 1114 | 10.0 | 990 | Blank |
| Comparative Example 3 | 1.0 | $2.2 \times 10^7$ | 1979 | 9.9 | 681 | Blank |

In Table 2, "Rsp" denotes an Rsp value calculated from values measured by pulse NMR; "LPC" denotes the number of counted coarse particles of 0.16 μm or more contained in each polishing composition (counts/mL); "Number of defects" denotes the number of defects of 180 nm or more per unit polished surface; "pH" denotes the adjusted pH of each polishing composition; "Electrical conductivity" denotes the electrical conductivity (μS/cm) of each polishing composition when the $SiO_2$ concentration is 10% by mass; and "DLS change rate" denotes the rate of change (%) in average particle diameter (nm) measured by dynamic light scattering as compared with that before addition of a basic nitrogen-containing organic compound.

In the Examples of the present invention, generation of defects can be reduced in the case of CMP polishing of the device wafer with a polishing composition containing silica particles and a basic nitrogen-containing organic compound and exhibiting an Rsp value falling within a specific numerical range as determined by pulse NMR. The results of Examples 5 to 8 indicate a usually unexpected effect; i.e., reduction of defects despite an increase in LPC.

In Comparative Examples 1 and 3, generation of defects is not reduced despite a high Rsp value, which indicates water affinity.

INDUSTRIAL APPLICABILITY

The polishing composition of the present invention can be used not only for CMP polishing of a device wafer, but also as a silicon wafer polishing agent or a quartz substrate polishing agent for a photomask. In addition to the aforementioned applications, the polishing composition of the present invention can be used for polishing of various targets, including metals or semimetals or alloys thereof, such as silicon, aluminum, nickel, tungsten, copper, tantalum, titanium, and stainless steel; glassy substances, such as quartz glass, aluminosilicate glass, and glassy carbon; ceramic materials, such as alumina, silica, sapphire, silicon nitride, tantalum nitride, and titanium carbide; compound semiconductor substrate materials, such as silicon carbide, gallium nitride, and gallium arsenide; and resin materials, such as polyimide resin. The polishing composition can be applied to a polishing target formed of a plurality of materials selected from these.

The invention claimed is:

1. A polishing composition comprising silica particles, a basic nitrogen-containing organic compound, and water serving as a solvent, wherein the composition exhibits an Rsp value of the following Formula (1) of more than 0.7 and 6 or less as calculated from values measured by pulse NMR:

$$Rsp = (Rav - Rb)/(Rb) \qquad (1)$$

(wherein Rsp is an index of water affinity; Rav is the reciprocal of the relaxation time of the polishing composition; and Rb is the reciprocal of the relaxation time of the water serving as a solvent of the polishing composition), wherein the amount of all the components(S) of the polishing composition except for the aqueous medium is 0.01 to 20% by mass, the silica content of the component(S) is 90 to 99.9% by mass, and the basic nitrogen-containing organic compound content of the component(S) is 0.01 to 10% by mass, wherein the composition exhibits an electrical conductivity of 100 to 650 $\mu$S/cm when the $SiO_2$ concentration is 10% by mass, and wherein the composition has a pH of 8 to 11.

2. The polishing composition according to claim 1, wherein the silica particles have an average primary particle diameter of 5 to 80 nm as measured by the nitrogen gas adsorption method, and the silica particles have an average particle diameter of 12 to 200 nm as measured by dynamic light scattering.

3. The polishing composition according to claim 1, wherein the basic nitrogen-containing organic compound is an aliphatic linear or cyclic amine containing a hydroxyl group, a carboxyl group, or a combination of these as appropriate, and the amine is a primary amine, a secondary amine, a tertiary amine, or any combination of these.

4. The polishing composition according to claim 1, wherein the basic nitrogen-containing organic compound is a molecule having a molecular weight of 60 to 350.

5. The polishing composition according to claim 1, wherein the basic nitrogen-containing organic compound is a secondary or tertiary linear aliphatic amine.

6. The polishing composition according to claim 1, wherein the basic nitrogen-containing organic compound is N-ethylethylenediamine or triethylamine.

7. The polishing composition according to claim 1, wherein the composition comprises an alkali component containing an alkali metal hydroxide containing NaOH or KOH or ammonia and a basic nitrogen-containing organic compound, or a salt of any of these; the following relation is satisfied: (the mole number of the basic nitrogen-containing organic compound or a salt thereof)>(the mole number of the alkali metal hydroxide containing NaOH or KOH or ammonia or a salt thereof).

8. The polishing composition according to claim 1, wherein the composition further comprises a pH adjuster containing an inorganic acid, an organic acid, an alkali metal hydroxide, an ammonium salt, ammonia, or any combination of these.

9. The polishing composition according to claim 1, wherein the composition further comprises a chelating agent containing an aminocarboxylic acid chelating agent, a phosphonic acid chelating agent, or a combination of these.

10. The polishing composition according to claim 1 wherein the composition is used for polishing of a silicon wafer, a device wafer, or an Si-containing substrate.

11. A method for producing the polishing composition according to claim 1, the method comprising a method (A) including mixing a silica sol prepared through any one step of the following steps (a) to (d) with the basic nitrogen-containing organic compound, or a method (B) including dispersing the silica sol and the basic nitrogen-containing organic compound in an aqueous medium:

step (a): a step of preparing a silica sol by ion exchange of an aqueous sodium silicate solution and thermal treatment of the resultant aqueous active silica solution;

step (b): a step of preparing a silica sol by hydrolysis of an alkoxysilane;

step (c): a step of preparing a silica sol by wet grinding of silica powder in an aqueous medium; and step (d): a step of preparing a silica sol by dispersion, in an aqueous medium, of silica powder obtained through combustion hydrolysis of silicon tetrachloride in a flame.

12. The method for producing the polishing composition according to claim 11, wherein the aqueous sodium silicate solution and/or the aqueous active silica solution used in the step (a) is preliminarily filtered with a filter.

13. The method for producing the polishing composition according to claim 11, wherein a rate of change in average particle diameter is less than 20% as measured by dynamic light scattering before and after addition of the basic nitrogen-containing organic compound.

14. The polishing composition according to claim 1, wherein the pH is at least 9.8 and no higher than 10.2.

15. The polishing composition according to claim 1, which additionally contains a water-soluble compound selected from monomeric compounds and polymeric compounds.

16. The polishing composition according to claim 1, which contains no water-soluble polymeric compounds.

17. A polishing method comprising polishing a TEOS film-coated wafer with the polishing composition according to claim 1 for 60 seconds, to thereby reduce the number of defects of 180 nm or more to 1.4 or less per $cm^2$.

18. The polishing method according to claim 17, wherein the TEOS film-coated wafer is a 300 mm wafer.

\* \* \* \* \*